United States Patent [19]

Seeber et al.

[11] Patent Number: 5,314,714
[45] Date of Patent: May 24, 1994

[54] PROCESS FOR INCREASING THE DENSITY AND IMPROVING THE HOMOGENEITY OF CHEVREL PHASE POWDERS AND CHEVREL PHASE WIRE OBTAINED USING SAID PROCESS

[75] Inventors: Bernd Seeber, Geneva; Oystein Fischer, Coppet; Michel Decroux, Geneva, all of Switzerland

[73] Assignee: Promogap, Switzerland

[21] Appl. No.: 445,853

[22] PCT Filed: Jan. 20, 1989

[86] PCT No.: PCT/CH89/00011
§ 371 Date: Sep. 3, 1989
§ 102(e) Date: Sep. 3, 1989

[87] PCT Pub. No.: WO89/06864
PCT Pub. Date: Jul. 27, 1989

[30] Foreign Application Priority Data
Jan. 22, 1988 [FR] France ............ 88 00900

[51] Int. Cl.$^5$ ............. B05D 5/12; B22F 7/02
[52] U.S. Cl. ........................ 427/62; 148/96; 419/10; 419/47; 505/823
[58] Field of Search ........... 148/96, 97; 419/4, 10, 419/47; 428/606; 505/823, 807; 75/252, 255; 423/508, 511; 427/62

[56] References Cited

U.S. PATENT DOCUMENTS

| | | | |
|---|---|---|---|
| 4,594,218 | 6/1986 | Dubots et al. | 419/4 |
| 4,746,373 | 5/1988 | Yamada et al. | 505/823 |
| 4,808,488 | 2/1989 | Chevrel et al. | 419/4 |
| 4,917,871 | 4/1990 | Dahn et al. | 423/511 |
| 4,966,749 | 10/1990 | Kondo et al. | 419/10 |

FOREIGN PATENT DOCUMENTS 171918 2/1986 European Pat. Off.

OTHER PUBLICATIONS

Tarascon, J. M. et al., "New superconducting ternary . . . TlMo$_6$Se$_8$", Physical Review B, Jan. 1, 1984, pp. 172–180.

Primary Examiner—George Wyszomierski
Attorney, Agent, or Firm—Davis, Bujold & Streck

[57] ABSTRACT

Process for increasing the density and improving the homogeneity of Chevrel phase powders and Chevrel phase wire obtained using said process. Chevrel phase powers are compounds of lead, mobydenum, and sulfur. Metallic additives in the range of 0.5% to 20% by weight are introduced in the Chevrel phase powders by a physical or chemical process. The melting temperature of the metallic additives is lower than the synthesis temperature of the Chevrel phase powders so as to increase the homogeneity. The wires obtained using this process are capable of generating high magnetic fields.

6 Claims, No Drawings

PROCESS FOR INCREASING THE DENSITY AND IMPROVING THE HOMOGENEITY OF CHEVREL PHASE POWDERS AND CHEVREL PHASE WIRE OBTAINED USING SAID PROCESS

The present invention concerns a process for increasing the density and improving the homogeneity of Chevrel phase powders.

This invention also concerns Chevrel phase wire obtained by this process.

At present, commercially available superconducting wires of NbTi and Nb$_3$Sn cannot produce magnetic fields in excess of about 18 Tesla. This limitation is due to superconducting properties such as the critical temperature $T_c$ and the upper critical field $H_{c2}$, which are specific for the materials and cannot be improved significantly. It can be confirmed that these materials reached their physical limits.

New materials named Chevrel phases are ternary molybdenum chalcogenides based on the formula $M_6X_8$ where M is a metal, in particular lead, tin or lanthanum, and X is a chalcogenide. Some of these compounds PbMo$_6$S$_8$, SnMo$_6$S$_8$ or LaMo$_6$Se$_8$ have remarkably high upper critical fields which make them good candidates for use in superconducting coils that can produce steady state magnetic fields above about 18 Tesla. For instance, PbMo$_6$S$_8$ (PMS) with a critical temperature of 15° K. and its critical field of 52 Tesla at 4.2° K. is a particularly interesting compound for practical use. This is two and a half time higher than the best commercially available superconductor Nb$_3$Sn. This opens, at least theoretically, the possibility of achieving steady state magnetic fields in the range of 45 Tesla, representing a considerable scientific and technical interest.

For the production of very high magnetic fields, the superconductors must be in the form of a wire which can be wound to a coil. Different attempts have been performed in order to manufacture Chevrel phase wires. Two different techniques may be distinguished: in the first, the Chevrel phase is deposited out of the gas phase onto a substrate in the form of a wire or tape and the second technique is based on a powder metallurgical method which has been described in "Ternary Supraconductors", Eds. G. K. Shenoy, B. D. Dunlap and F. Y. Fradin, Elsevier North Holland, 1981, page 119. For the manufacturing of large lengths and quantities the powder metallurgical approach is the most economic.

Corresponding to the known techniques for manufacturing Chevrel phase wires, a very fine powder of Chevrel phase with a mean particle size inferior to 1 um is obtained by grinding after the last heat treatment. The grinding can be done for instance in a planetary mill. Then the Chevrel phase powder is pressed isostatically at ambient or elevated temperatures into the form of a cylinder, machined, passed and sealed under vacuum into one or more metallic cans (matrix material). The most commonly used materials for the matrix are, for instance, stainless steel with a diffusion barrier of molybdenum (see also Proceedings of the International Conference on Magnet Technology MT9, Zürich, 1985, page 560). Other materials such as niobium, tantalum or silver may also be used for the diffusion barrier.

It is known that an interesting critical current density for the Chevrel phase supraconductors can be reached only if the residual porosity of the Chevrel phase powders is as small as possible. In other words the more the effective density of the Chevrel phase powders approaches the theoretical density, the more the current quantity capable of being transferred by these superconductors is important.

After many investigations of hot pressed Chevrel phase powders it has been seen that, after other physical parameters, the specific mass influences the critical current density in a not inconsiderable manner. The highest specific mass and critical current density of Chevrel phase samples has been obtained after hot pressing at about 1100° C. and under pressure of the order of 2,5 kbar. During the manufacturing of Chevrel phase wires with a stainless steel matrix and a molybdenum diffusion barrier, conditions approximating the above conditions are obtained by the applied hot extrusion at 1200° C. and the subsequent hot swagging and/or hot drawing.

One possibility of obtaining a high density in a Chevrel phase wire is described in a European patent application published under EP 0181 496. In a first distortion stage the superconducting Chevrel phase is extruded at temperatures of between 1000° C. and 1600° C. in order to obtain a 1 to 10 fold reduction of the cross section. This first distortion stage is followed by several distortion stages comprising hot swagging and/or hot drawing.

For higher magnetic fields, the critical current densities of these Chevrel phase wires are comparable to those of Nb$_3$Sn, which means that Chevrel phase wires are suitable for the fabrication of superconducting coils.

The European patent application published under EP 0138 719 has the aim of eliminating or reducing the residual porosity between the Chevrel phase particles, which are supposed to be responsible for the low critical current density of the superconducting filament. This aim is obtained by adding metallic powders with a mean particle size inferior to those of the Chevrel phase powder. These metallic powders are aluminium, silver, rhenium, titanium and gallium because the annealing temperature after the wire drawing can be reduced to about 800° C.

On the other hand, it is known that, by introducing a second phase acting as a bonding agent (binder) in a subsequent liquid and/or gaseous phase sintering process the connections between the powder particles are considerably improved. This technique is, for instance, currently used for the manufacturing of the so-called "Cermets", a ceramic composite with a metallic binder. In order to apply this process to the preparation of Chevrel phase powders and Chevrel phase wires the following conditions must be respected:

- the bonding agent (binder) may not degrade superconducting parameters such as the critical temperature $T_c$, the upper critical field $H_{c2}$ and the critical current density $J_c$,
- the bonding agent (binder) must have a good adhesive strength in order to wet all powder particles completely, and
- the bonding agent (binder) may not degrade the mechanical properties of the Chevrel phase powder and Chevrel phase wire at liquid helium temperatures (4.2 K.).

The object of the present invention is to improve the specific mass of the Chevrel phase superconductor and consequently, to increase the critical current density. In particular, the residual pores, probably of a microscopic scale, must be filled. Moreover a better connection between the powder particles of the Chevrel phase is required resulting in a much better homogeneity of the superconductor by an improved chemical reaction during the heat treatment.

These objects can be attained by the present invention characterized in that additives consisting of a metal, a mixture of several metals and/or a metal alloy having a low melting temperature inferior to the synthesis temperature of the Chevrel phase, are introduced in said Chevrel phase powders.

According to a particularly advantageous mode of realization, these additives are introduced in the form of powders followed by a liquid and/or gaseous phase sintering at elevated temperatures.

According to another particularly advantageous mode of realization these additives are introduced by cladding the Chevrel phase powder by a physical or chemical process.

This cladding is preferably done by an evaporation process.

The additive may be selected in order to have a particular affinity for parasitic chemical elements, such as oxygen.

According to a preferred mode of realisation, the additives contain lead or tin and/or a mixture or an alloy of lead and tin.

According to the first advantageous mode of realization, the additives are introduced in the form of powders with a mean particle size inferior to 1 $\mu$m. The Chevrel phase powder has the preferred constituents of lead, molybdenum and sulphur ($PbMo_6S_8$). Other Chevrel phase compounds, for instance with tin, lanthanum as the M-element and selenium as the X-element, can also be used.

A stoichiometric or non-stoichiometric powder mixture of $PbS$, $MoS_2$ and $Mo$ can be used.

All these powders are preferably used in a powder form.

According to another advantageous mode of realization, chemical transport agents based on halogenides and chalcogenides of metals present in the Chevrel phase compound are used.

The Chevrel phase wire obtained by the process according to the invention is characterized in that it comprises Chevrel phase powders of which the specific mass and the homogeneity, and consequently the critical current density are improved by the described process.

The present invention may be understood with reference to the description of examples, which are given in more detail below.

According to a first example of realization, a metal with a low melting temperature (for instance tin or lead, or a mixture or an alloy tin and lead), is added to a powder, or to a mixture of powders forming a Chevrel phase compound (for instance $PbMo_6S_8$). The amount of this additive is in the range of between 0.5% by weight and 20% by weight. After mixing of the powders they are subject to a liquid and/or gaseous phase sintering at temperatures of between 500° C. and 1700° C. Then the blend is treated in a mixing machine during 2 to 24 hours. For the manufacture of the Chevrel phase wire the so-obtained billet is machined and passed into the extrusion cans. The manufacture of the Chevrel phase wire is described in the European patent application published under EP 0181 496.

According to a second example of realization a cladding of the Chevrel phase powder with a metallic additive of low melting point, for instance tin or lead, or a mixture or an alloy of tin and lead is done by a physical or chemical process.

According to a third example of realization additives which act as chemical transport agents, for instance halogenides or chalcogenides of metals present in the Chevrel phase compound, are added in the proportion of 1% by weight to 10% by weight and this compound is subjected to a liquid or gaseous phase sintering at a temperature of between 500° C. and 1700° C.

According to other examples of realization, other metallic powders or a mixture of powders with low melting points such as: bismuth, gallium, indium, antimony, thallium or alloys between these elements and lead or tin can be mixed with the Chevrel phase powder. Then an isostatical pressing at ambient or elevated temperature is done on these compounds.

The liquid or gaseous phase sintering can be performed before, during or after the wire manufacturing process by extrusion, swagging or flattering and wire drawing. At a high temperature, the additives flow and form a liquid or gaseous phase favouring the diffusion between the Chevrel phase powder particles. In this way the chemical reaction and therefore the homogeneity is improved and the powder particles are more effectively soldered together. In the case of gaseous phase sintering, the presence of a transport agent (halogenides or chalcogenides of metals which are contained in the Chevrel phase compounds), a chemical transport reaction takes place, leading to the same result.

The critical current density of Chevrel phase powders and Chevrel phase wires obtained by this invention is two to three times higher with respect to other known processes, without the above mentioned additives. In addition, owing to the additives a strong reduction of the inductive transition width of the critical temperature is obtained indicating the superior homogeneity of the superconductor. This has also been confirmed by specific heat measurements near to the critical temperature (diminution of the specific heat anomaly in temperature). Finally, the improvement of the homogeneity allows the increase of the critical field $H_{c2}$.

Owing to the fact that Chevrel phase wires manufactured according to this invention show improved critical current densities two to three times higher than those obtained by other known processes without the above mentioned additives, an industrial realisation of Chevrel phase wires can be seriously considered.

The addition of metals or metal alloys with a low melting point or the addition of chemical transport agents allows a liquid or gaseous sintering process bonded with Chevrel phase powders to be obtained.

Only additives which permit the consequent addition of the critical parameters such as $T_c$, $H_{c2}$ and Jc can be taken into consideration, and only if these additives permit sufficient impregnation.

We claim:

1. A process for increasing the specific mass and improving the critical current density of a Chevrel phase material having super conducting properties and formed from Chevrel phase powders, said process comprising the steps of:

adding metallic additives to said Chevrel phase powders, said metallic additives having a melting temperature which is lower than a synthesis temperature of said Chevrel phase powders;

said metallic additives being added in a range of from about 0.5% to 20% by weight, said metallic additives being selected from the group consisting of a metal, a mixture of several metals or a mixture of several metal alloys, at least one of said metallic additives comprising tin and said metallic additives functioning as bonding agents to increase bonding of said Chevrel phase powders for ensuring a better homogeneity of the resulting Chevrel phase material; and performing one of a physical cladding operation and a chemical cladding operation so as to overlap the Chevrel phase powders with a coating of said metallic additives.

2. A process according to claim 1, wherein at least one of said metallic additives has a high affinity for oxygen.

3. A process according to claim 1, wherein at least one of said metallic additives comprises lead.

4. A process according to claim 1, wherein said Chevrel phase powders comprise at least one of:
 a) a lead, molybdenum, sulphur composition,
 b) a tin, molybdenum, sulphur composition, or
 c) a lanthanum, molybdenum, selenium composition.

5. A process for increasing the specific mass and improving the critical current density of a Chevrel phase material having superconducting properties and formed from Chevrel phase powders, said process comprising the steps of:

adding metallic additives to said Chevrel phase powders, said metallic additives having a melting temperature which is lower than a synthesis temperature of said Chevrel phase powders;

said metallic additives being added in a range of from about 0.5% to 20% by weight, said metallic additives being selected from the group consisting of a metal, a mixture of several metals or a mixture of several metal alloys, and said metallic additives functioning as bonding agents to increase bonding of said Chevrel phase powders for ensuring a better homogeneity of the resulting Chevrel phase material;

introducing said metallic additives in the form of powder;

mixing together said metallic additive powders with said Chevrel phase powders;

performing one of a physical evaporation process and a chemical evaporation process so as to overlap the Chevrel phase powders with a coating of said metallic additive; and sintering the resulting mixture of said metallic additives and said Chevrel phase powders in one of a liquid zone and vapor zone at a temperature of between 500° C. and 1700° C.

6. A process for increasing the specific mass and improving the critical current density of a Chevrel phase material having super conducting properties and formed from Chevrel phase powders, said process comprising the steps of:

adding metallic additives and chemical transport agents to said Chevrel phase powders, said metallic additives having a melting temperature which is lower than a synthesis temperature of said Chevrel phase powders;

said metallic additives being added in a range of from about 0.5% to 20% by weight, said metallic additives being selected from the group consisting essentially of a metal, a mixture of several metals or a mixture of several metal alloys, and said metallic additives functioning as bonding agents to increase bonding of said Chevrel phase powders for ensuring a better homogeneity of the resulting Chevrel phase material;

said chemical transport agents being added in a proportion of from about 1% to 10% by weight, said chemical transport agents including halogenides and chalcogenides of metals; and performing one of a physical cladding operation and a chemical cladding operation so as to overlap the Chevrel phase powders with a coating of said metallic additives.

* * * * *